(12) United States Patent
Lassalle-Balier et al.

(10) Patent No.: US 11,782,103 B2
(45) Date of Patent: Oct. 10, 2023

(54) DUAL DOUBLE-PINNED SPIN VALVE ELEMENT HAVING MAGNET BIAS WITH INCREASED LINEAR RANGE

(71) Applicant: Allegro MicroSystems, LLC, Manchester, NH (US)

(72) Inventors: Rémy Lassalle-Balier, Bures sur Yvette (FR); Paolo Campiglio, Arcueil (FR); Noémie Belin, Villejuif (FR); Damien Dehu, La-Ville-du-Bois (FR); Jeffrey Eagen, Manchester, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 515 days.

(21) Appl. No.: 16/899,746

(22) Filed: Jun. 12, 2020

(65) Prior Publication Data

US 2021/0389393 A1 Dec. 16, 2021

(51) Int. Cl.
*G01R 33/09* (2006.01)

(52) U.S. Cl.
CPC ......... *G01R 33/091* (2013.01); *G01R 33/093* (2013.01); *G01R 33/098* (2013.01)

(58) Field of Classification Search
CPC ............................ G01R 33/091; G11B 5/3903
See application file for complete search history.

(56) References Cited

U.S. PATENT DOCUMENTS

| 9,741,372 B1 | 8/2017 | Campiglio |
| 9,812,637 B2 | 11/2017 | Fermon et al. |
| 9,922,673 B2 | 3/2018 | Campiglio et al. |
| 10,026,425 B2 | 7/2018 | Campiglio |
| 10,347,277 B2 | 7/2019 | Campiglio et al. |
| 10,620,279 B2 | 4/2020 | Campiglio et al. |
| 10,670,669 B2 | 6/2020 | Lassalle-Balier et al. |
| 10,734,443 B2 | 8/2020 | Lassalle-Balier et al. |
| 10,753,989 B2 | 8/2020 | Campiglio et al. |
| 10,777,345 B2 | 9/2020 | Lassalle-Balier et al. |
| 10,950,260 B1 * | 3/2021 | Freitag ................. G01R 33/093 |
| 2004/0085683 A1 | 5/2004 | Lin et al. |
| 2007/0019338 A1 * | 1/2007 | Childress ............. G01R 33/093 |
| | | 360/324.1 |
| 2010/0327857 A1 | 12/2010 | Hoshiya et al. |

(Continued)

FOREIGN PATENT DOCUMENTS

| EP | 3 531 153 A1 | 8/2019 |
| JP | WO 2010/029684 A1 | 2/2012 |
| JP | WO 2011/007767 | 12/2012 |

OTHER PUBLICATIONS

Response to Official Communication dated Dec. 20, 2021 and Extended European Search Report dated Aug. 30, 2021 for European Application No. 21160571.2; Response filed Jun. 15, 2022; 28 Pages.

(Continued)

*Primary Examiner* — Reena Aurora
(74) *Attorney, Agent, or Firm* — Daly, Crowley, Mofford & Durkee, LLP (57) ABSTRACT

In one aspect, a dual double-pinned spin valve element includes a first spin valve that includes a first pinned layer and a second pinned layer and a second spin valve disposed on the first spin valve and comprising a third pinned layer and a fourth pinned layer. The first, second, third and fourth pinned layers each have a magnetization in a first direction.

20 Claims, 6 Drawing Sheets

(56) References Cited

U.S. PATENT DOCUMENTS

| | | |
|---|---|---|
| 2011/0062537 A1 | 3/2011 | Oh et al. |
| 2016/0359103 A1 | 12/2016 | Fermon et al. |
| 2018/0335486 A1 | 11/2018 | Lassalle-Balier et al. |
| 2019/0178954 A1 | 6/2019 | Lassalle-Balier et al. |
| 2019/0234763 A1 | 8/2019 | Foletto et al. |
| 2019/0235032 A1 | 8/2019 | Lassalle-Balier |
| 2019/0259520 A1 | 8/2019 | Lassalle-Balier et al. |
| 2020/0033424 A1 | 1/2020 | Campiglio et al. |
| 2020/0066790 A1 | 2/2020 | Lassalle-Balier et al. |
| 2020/0200840 A1 | 6/2020 | Campiglio et al. |

OTHER PUBLICATIONS

Extended European Search Report dated Aug. 30, 2021 for European Application No. 21160571.2; 10 Pages.
U.S. Appl. No. 16/507,552, filed Jul. 10, 2019, Lassalle-Balier et al.
U.S. Appl. No. 16/987,502, filed Aug. 7, 2020, Lassalle-Balier et al.

\* cited by examiner

DUAL DOUBLE-PINNED SPIN VALVE ELEMENT HAVING MAGNET BIAS WITH INCREASED LINEAR RANGE

BACKGROUND

Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

In certain applications, magnetic field sensors include magnetoresistance elements. These elements have an electrical resistance that changes in the presence of an external magnetic field. Spin valves are a type of magnetoresistance element formed from two or more magnetic materials or layers. The simplest form of a spin valve has a reference (or magnetically fixed) layer and a free layer. The resistance of the spin valve changes as a function of the magnetic alignment of the reference and free layers. Typically, the magnetic alignment of the reference layer does not change, while the magnetic alignment of the free layer moves in response to external magnetic fields.

In some cases, a spin valve may also have a bias. The bias may be generated by one or more magnetic layers (bias layers) that are magnetically coupled to the free layer. In the absence of an external magnetic field, the bias layers may cause the magnetic alignment of the free layer to default to a predetermined alignment. The magnetic coupling between the bias layers and the free layer is relatively weak so that an external field can override the bias and realign the magnetic alignment of the free layer.

SUMMARY

In one aspect, a dual double-pinned spin valve element includes a first spin valve that includes a first pinned layer and a second pinned layer and a second spin valve disposed on the first spin valve and comprising a third pinned layer and a fourth pinned layer. The first, second, third and fourth pinned layers each have a magnetization in a first direction.

In another aspect, a method includes depositing a stack comprising a dual double-pinned spin valve element and performing an anneal on the stack. The dual double-pinned spin valve element includes a first spin valve that includes first and second pinned layers; and a second spin valve that includes third and fourth pinned layers. The anneal enables that each of the first, second, third and four pinned layers to have a magnetic direction that is parallel to each other.

In a further aspect, a dual double-pinned spin valve element includes a first spin valve and a second spin valve disposed on the first spin valve. The first spin valve includes a first bias layer that includes a first pinned layer and a first pinning layer; and a first reference layer that includes a second pinned layer and a second pinning layer. The second spin valve includes a second bias layer that includes a third pinned layer and a third pinning layer; and a second reference layer that includes a fourth pinned layer and a second pinning layer. The first, second, third and fourth pinned layers each have a magnetization in a first direction and the first or second spin valve is one of a tunneling magnetoresistance element or a giant magnetoresistance (GMR) element.

In a still further aspect, a magnetic sensor, includes a first dual double-pinned spin valve element that includes a first, second, third and fourth pinned layers each have a magnetization in a first direction; and a second dual double-pinned spin valve element that includes a fifth, sixth, seventh and eighth pinned layers each have a magnetization in the first direction. The first dual double-pinned spin valve element and the second dual double-pinned spin valve element are connected in series or in parallel to each other. The first dual double-pinned spin valve element is biased by a first magnet in a second direction and the second dual double-pinned spin valve element is biased by a second magnet in a third direction. The third direction is in the opposite direction to the second direction.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to fabricate a magnetic sensor that has magnetoresistance (MR) elements (e.g., TMR, GMR and so forth) that have an increased linear range than traditional MR elements. As used herein the term "linear range" refers to a range where the changes in resistivity of an MR element are linear with respect to changes in an intensity of a magnetic field along a sensitive direction. An improved linear range enables a better immunity to magnet asymmetry in back-bias magnet products.

Figure 1A:
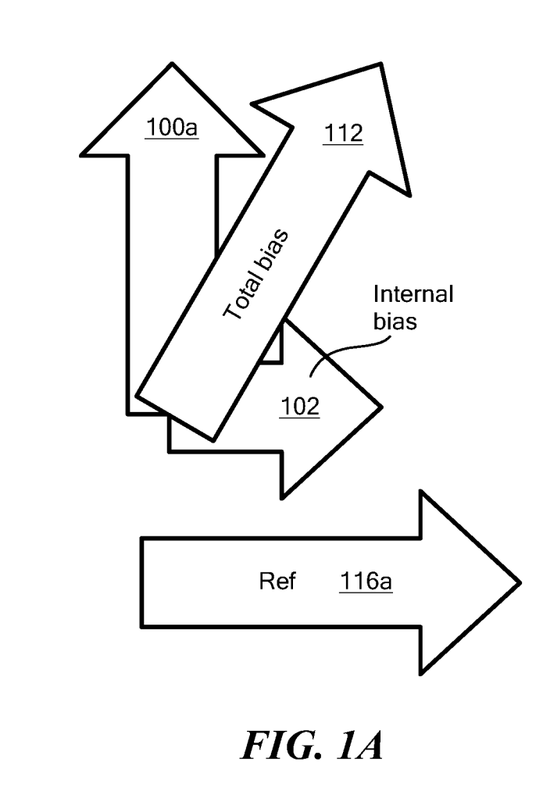
FIG. 1A is a diagram of biasing effect caused by a magnet on a first spin valve of a double spin valve.
Figure 1B:
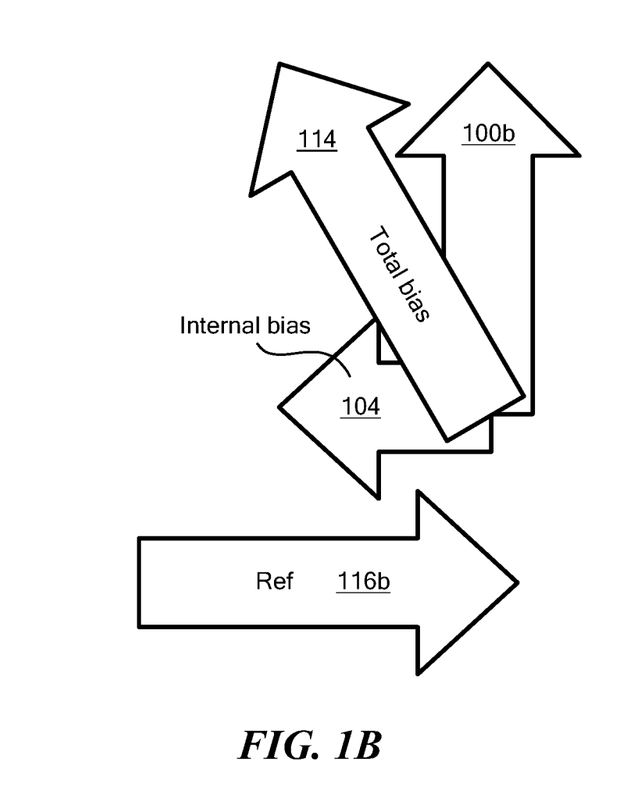
FIG. 1B is a diagram of biasing effect caused by the magnet on a second spin valve of the double spin valve.

FIG. 1A depicts the effects of biasing by a magnet on a first spin valve of a double spin valve and FIG. 1B depicts the effects of biasing by the magnet on a second spin valve of the double spin valve. A magnetic field vector 100a represents the bias from the magnet at the first spin valve and a magnetic field vector 100b represents the bias from the magnet at the second spin valve. An arrow 116a represents a reference direction of the first spin valve and an arrow 116b represents a reference direction of the second spin valve. As used herein the term "reference direction" is a direction where the spin valve is most sensitive to changes in a magnetic field intensity.

The first spin valve has an internal bias vector 102, which is parallel to the reference direction 116a, and the second spin valve has an internal bias vector 104, which is antiparallel to the reference direction 116b. The vectors 102, 104 are antiparallel to each other to produce a linear range centered about a zero magnetic intensity.

In other examples, internal biases of each spin valve may have different bias directions from each other or have parallel bias directions, but different bias amplitudes to be able to select the center of a linear range. For example, if a requirement for a linear range to centered at −50 Oe was desired, then one spin valve could have a bias of +50 Oe and the other spin valve could have a bias of −150 Oe.

Combining the vector 100a with the internal bias direction 102 yields a total bias vector 112 and combining the vector 100b with the internal bias direction 104 yields a total bias vector 114. The total bias vectors 112, 114 are not parallel to each other. The result of having the total biases of each spin valve not parallel with the magnetic field leads to an extended linear range than traditional devices.

Figure 2A:
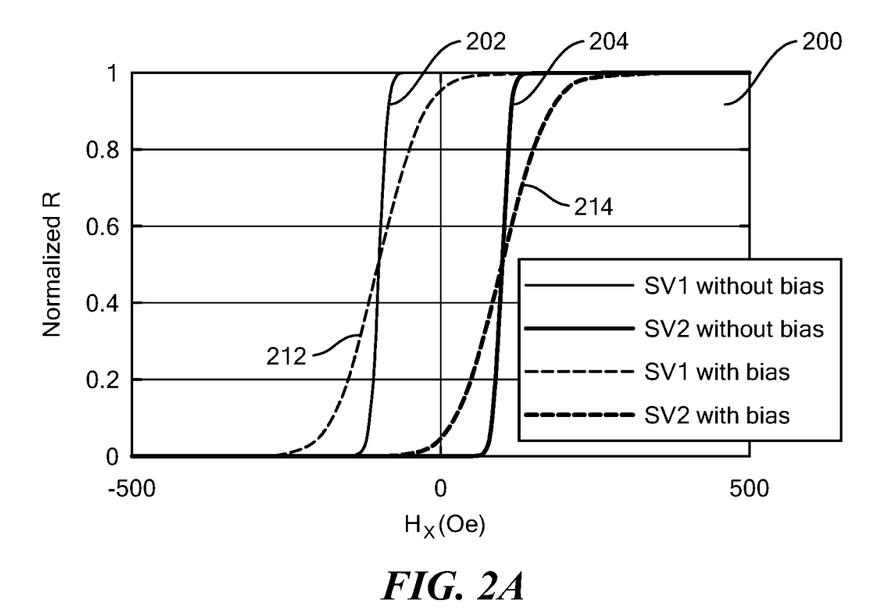
FIG. 2A is a graph of normalized resistance versus magnetic field intensity for each spin valve of a double spin valve with and without a bias from a magnet.

Referring to FIG. 2A, a graph 200 depicts normalized resistance versus magnetic intensity curves for each spin valve of a double spin valve separately. For example, a curve 202 depicts a first spin valve of the double spin valve without a bias from a magnet and a curve 204 depicts a second spin valve of the double spin valve without the bias from the magnet. In other examples, a curve 212 depicts the first spin valve of the double spin valve with the bias of the magnet bias and a curve 214 depicts the second spin valve of the double spin valve with the bias of the magnet.

Figure 2B:
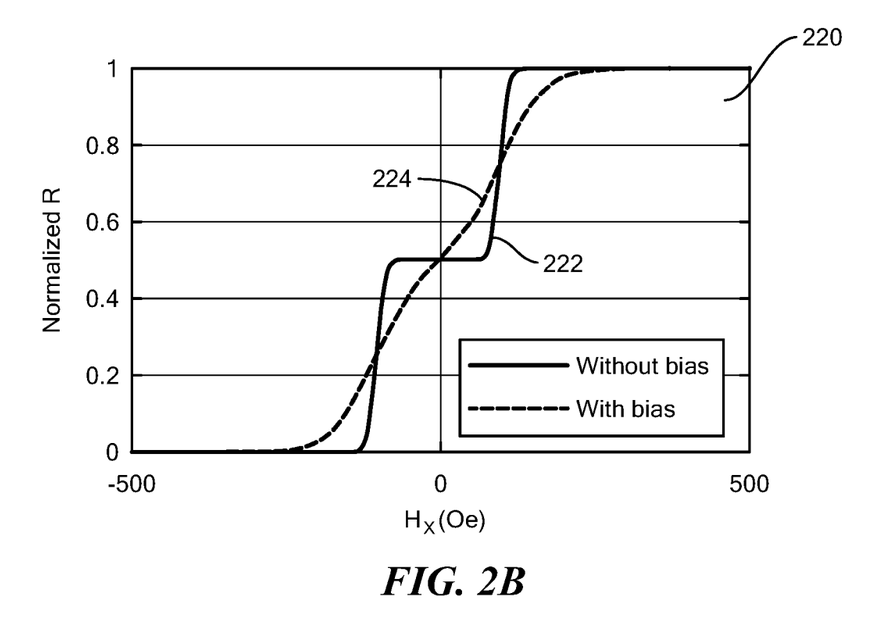
FIG. 2B is a graph of normalized resistance versus magnetic field intensity for the double spin valve device with and without the bias from the magnet.

Referring to FIG. 2B, a graph 220 depicts normalized resistance versus magnetic intensity curves for the double spin valve. A curve 222 depicts the double spin valve without the bias of the magnet and a curve 224 depicts the double spin valve with the bias of the magnet. One of ordinary skill in the art would recognize that the linear range in the curve 224 extends from about −200 Oersted (Oe) to 200 Oe while a single spin valve provides only a linear range between about −50 Oe to 50 Oe.

Figure 3A:
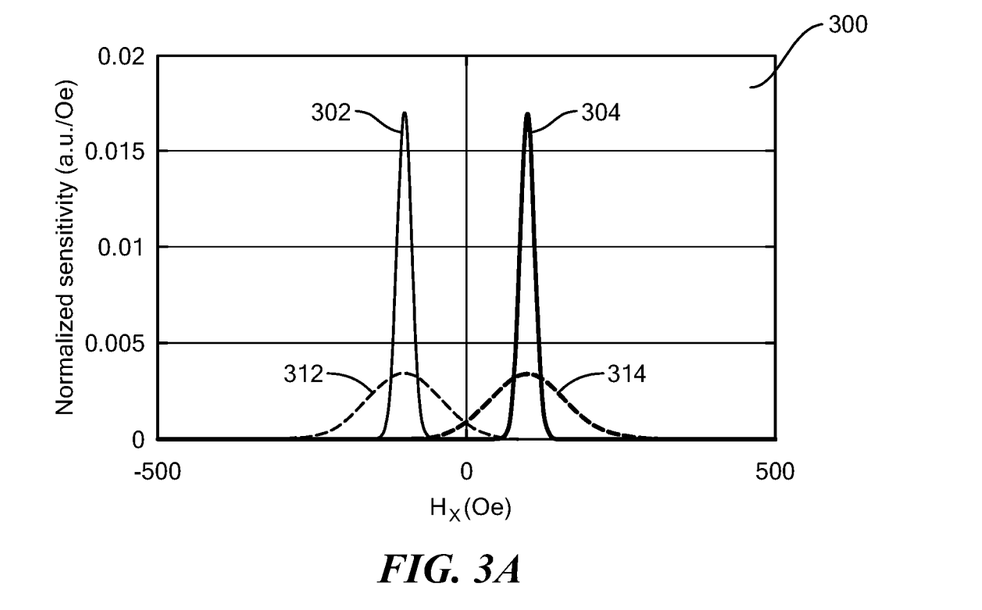
FIG. 3A is a graph of normalized sensitivity versus magnetic field intensity for each of the spin valves of the double spin valve with and without the bias from the magnet.

Referring to FIG. 3A, a graph 300 depicts normalized sensitivity versus magnetic intensity curves for each spin valve of the double spin valve separately. For example, a curve 302 depicts the first spin valve of the double spin valve without a magnet bias and a curve 304 depicts the second spin valve of the double spin valve without a magnet bias. A curve 312 depicts the first spin valve of the double spin valve with a magnet bias and a curve 314 depicts the second spin valve of the double spin valve with a magnet bias.

Figure 3B:
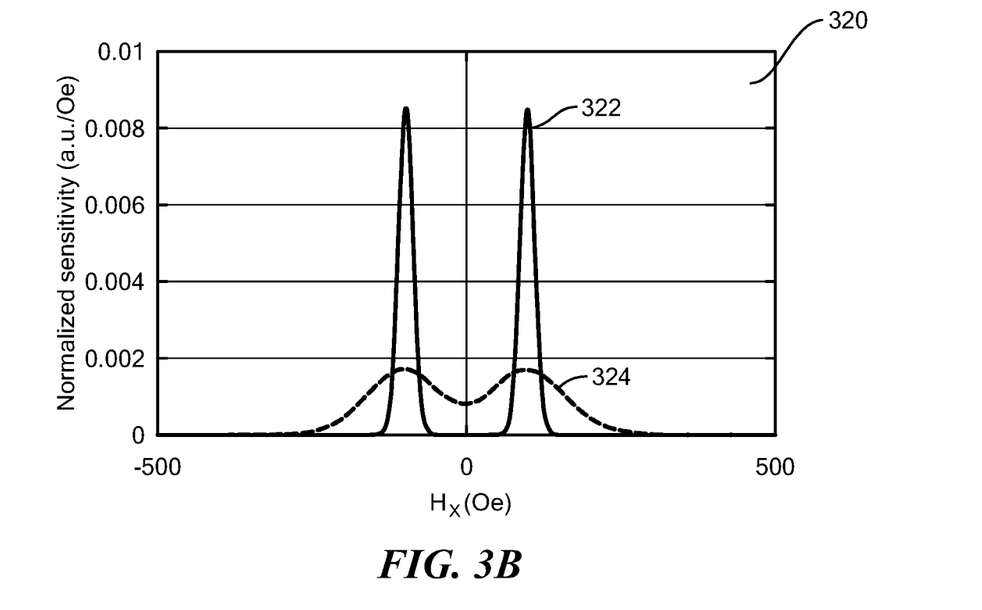
FIG. 3B is a graph of normalized sensitivity versus magnetic field intensity for the double spin valve spin with and without the bias of a magnet.

Referring to FIG. 3B, a graph 320 depicts normalized sensitivity versus magnetic intensity curves for the double spin valve. A curve 322 depicts the double spin valve without the bias of the magnet and a curve 324 depicts the double spin valve with the bias of the magnet. One of ordinary skill in the art would recognize that the sensitivity of a double spin valve biased with a magnet as shown in the curve 324 extends from about −200 Oersted (Oe) to 200 Oe while a single spin valve provides only sensitivity between about −50 Oe to 50 Oe.

Figure 4:
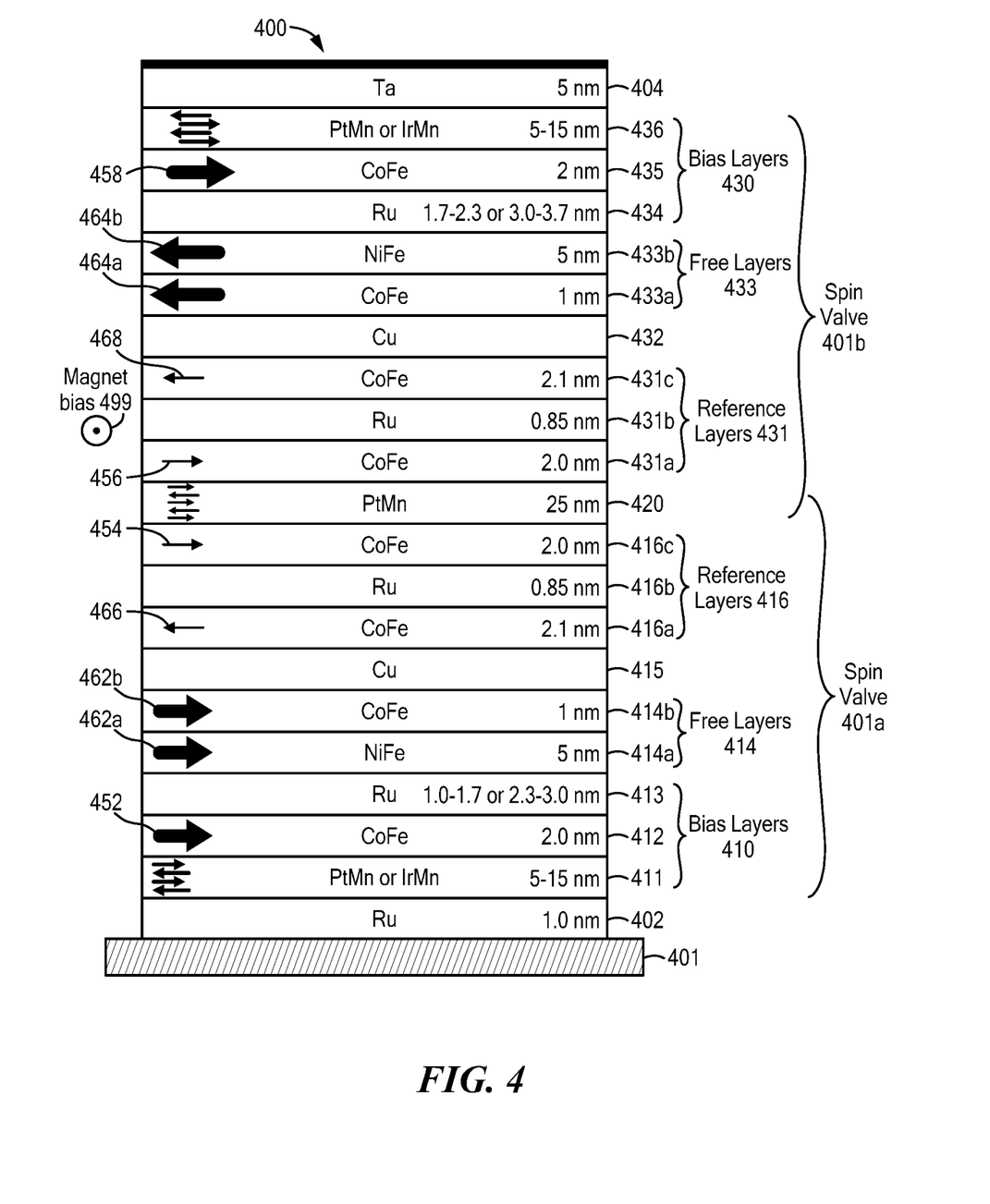
FIG. 4 is a diagram of an example of a dual double-pinned spin valve element with pinned layers each having the same magnetization direction.

Referring now to FIG. 4, an MR element 400 is an example of a dual double-pinned spin valve element with pinned layers having magnetization in the same direction. The MR element 400 is deposited or otherwise provided upon a substrate 401 and includes a plurality of layers. The plurality of layers includes a nonmagnetic seed layer 402 disposed over the substrate 401, a first spin valve 401a disposed over the nonmagnetic seed layer 402 and a second spin valve 401b disposed over the first spin valve 401a. The plurality of layers also includes an antiferromagnetic pinning layer 420, which is shared by the first spin valve 401a and the second spin valve 401b, and a nonmagnetic cap layer 404 disposed over the second spin valve 401b.

The first spin valve 401a includes bias layers 410, free layer 414 and reference layers 416. The bias layers 410 includes an antiferromagnetic pinning layer 411 disposed over the nonmagnetic seed layer 402 and a ferromagnetic pinned layer 412 disposed over the antiferromagnetic pinning layer 411. The first spin valve 401a also includes a nonmagnetic spacer layer 413 disposed over the ferromagnetic pinned layer 412 with the free layers 414 structure 414 disposed over the nonmagnetic spacer layer 413. The free layers 414 includes a first ferromagnetic free layer 414a and a second ferromagnetic free layer 414b disposed over the first ferromagnetic free layer 414a.

The first spin valve 401a further includes a nonmagnetic spacer layer 415 disposed over the free layers 414 with the reference layers 416 disposed over the nonmagnetic spacer layer 415. The reference layers 416 includes a ferromagnetic layer 416a, a ferromagnetic pinned layer 416c and a nonmagnetic spacer layer 416b disposed therebetween.

The second spin valve 401b, which is similar to the first spin valve 401a, but includes layers that are in a substantially reverse order or arrangement as the layers which are shown in the first spin valve 401a with respect to the seed layer 402, includes reference layers 431 disposed over the antiferromagnetic pinning layer 420, a nonmagnetic spacer layer 432 disposed over the reference layers 431 and free layers 433 disposed over the nonmagnetic spacer layer 432. The reference layers 431 includes a first ferromagnetic layer 431a, a second ferromagnetic pinned layer 431c and a nonmagnetic spacer layer 431b disposed therebetween. Additionally, the free layers 433 includes a first ferromagnetic free layer 433a and a second ferromagnetic free layer 433b disposed over the first ferromagnetic free layer 433a.

The second spin valve 401b also includes bias layers 430. The bias layer 430 includes nonmagnetic spacer layer 434 disposed over the free layers 433, a ferromagnetic pinned layer 435 disposed over the nonmagnetic spacer layer 434 and an antiferromagnetic pinning layer 436 disposed over the ferromagnetic pinned layer 435. A nonmagnetic cap layer 404 is disposed over the antiferromagnetic pinning layer 436.

Each of the layers in MR element 400 includes one or more respective materials (e.g., magnetic materials) and has a respective thickness, as shown. Materials of the layers are shown by atomic symbols. Additionally, thicknesses of the layers are shown in nanometers. In other embodiments, the material and thicknesses of the layers in MR element 400 may be replaced with other materials and thicknesses.

While the layers of MR element 400 (FIG. 4), including their respective thicknesses and materials, are known in the art (see, for example, FIG. 20 of U.S. Pat. No. 9,812,637), magnetization directions of certain layers as described herein are not known in the art. Arrows are shown that are indicative of magnetization directions of the layers. Arrows coming out of the page are indicated as dots within circles and arrows going into the page are indicated as crosses within circles.

The ferromagnetic pinned layer 412 has a magnetization in a direction 452. The ferromagnetic pinned layer 416c has a magnetization in a direction 454. The ferromagnetic pinned layer 431a has a magnetization in a direction 456. The ferromagnetic pinned layer 435 has a magnetization in a direction 458. After a single anneal process, the magnetization directions 452, 458 point in the same direction as magnetization directions 454, 456 (which is to the right of the page in FIG. 4).

The free layers 414 have the same magnetization direction as the ferromagnetic pinned layer 412 due to ferromagnetic coupling due to the thickness of the nonmagnetic spacer layer 413. That is, a magnetization direction 462a of the first ferromagnetic free layer 414a and a magnetization direction 462b of the second ferromagnetic free layer 414b point in the same direction as magnetization direction 452.

The free layers 433 have the opposite magnetization direction as the ferromagnetic pinned layer 435 due to antiferromagnetic coupling due to the thickness of the nonmagnetic spacer layer 434. That is, a magnetization direction 464a of the first ferromagnetic free layer 433a and a magnetization direction 464b of the second ferromagnetic free layer 433b point in the opposite direction as magnetization direction 458.

A magnet bias 499 with the MR element 400 enables an extended linear range with respect to traditional devices.

Figure 5:
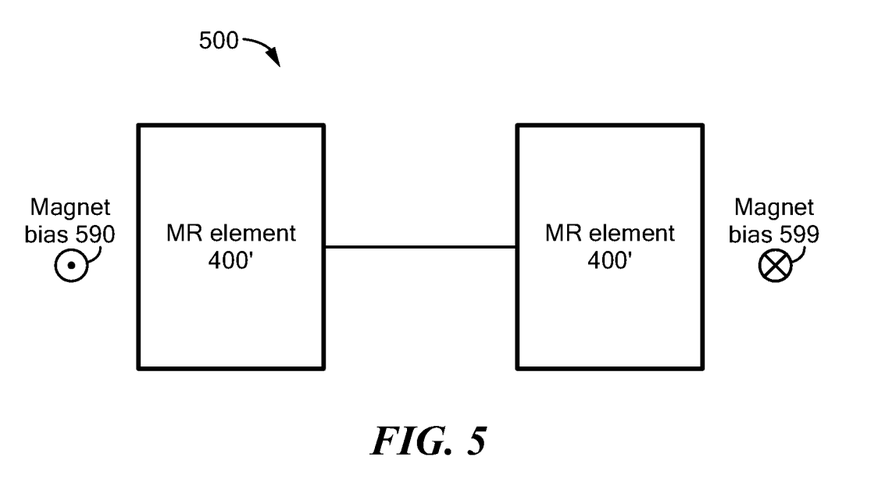
FIG. 5 is a diagram of an example of a magnetic sensor having two dual double-pinned spin valve elements with pinned layers each having the same magnetization direction.

Referring to FIG. 5, the MR element 400 (FIG. 4) may be used with other MR elements fabricated like MR element 400 to reduce the effects of stray fields. In one example, a magnetic field sensor includes an MR element 400' and an MR element 400" that are connected in series. The MR element 400' is biased by a magnet bias 590 coming out of the page and the MR element 400" is biased by a magnet bias 599 going into the page. By having two MR elements with pinned layers aligned in the same direction and each biased by a magnet in an opposite direction from the other magnet, a stray magnetic field immunity is formed. For example, a stray magnetic field parallel to a magnetic bias is compensated for because both dual double-pinned spin valve elements are included. That is, one dual double-pinned spin valve element will increase the bias (hence decrease the sensitivity) while the other dual double-pinned spin valve element will decrease the bias (hence increase the sensitivity). Thus, the effect on one dual double-pinned spin valve element is compensated for by the effect on the other dual double-pinned spin valve element.

In one example, the MR element 400' and the MR element 400" are the same structure as the MR element 400 (FIG. 4). In other examples, the MR element 400' and the MR element 400" do not have identical layers, but each has pinned layers with a magnetization direction that point in the same direction.

In other examples, the MR element 400' and the MR element 400" may be connected in parallel. In one example, the MR element 400' and the MR element 400" may be used together as a single unified element. Multiple unified elements may be used to form bridges in magnetic field sensors.

Figure 6:
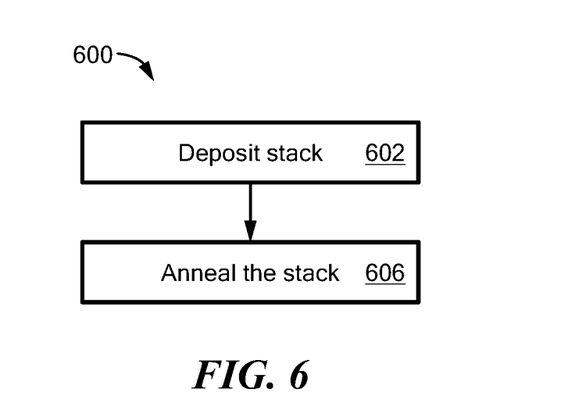
FIG. 6 is a flowchart of an example of a process to fabricate a dual double-pinned spin valve element with pinned layers each have the same magnetization direction.

Referring to FIG. 6, an example of a process to fabricate a dual double-pinned spin valve like, for example, the MR element 400 of FIG. 4 is a process 600. Process 600 deposits a stack of layers (602). For example, the stack of layers or layers 402, 414, 415, 416, 420, 431, 433, 430, 404 are deposited on the substrate 401 (FIG. 4). Process 600 performs an anneal along the sensitive axis (606). In one example, the sensitive axis is fixed by the directions 466, 468 (FIG. 4). In one example, the stack in processing block 602 is heated for one hour at 290° C. in the presence of a magnetic field having an intensity of 10k Oe. The fabrication of the stack requires only a single anneal step, while traditional methods of fabricating double pinned MR elements perform a second anneal at a lower temperature than the first anneal at 90° from the sensitive axis.

Figure 7:
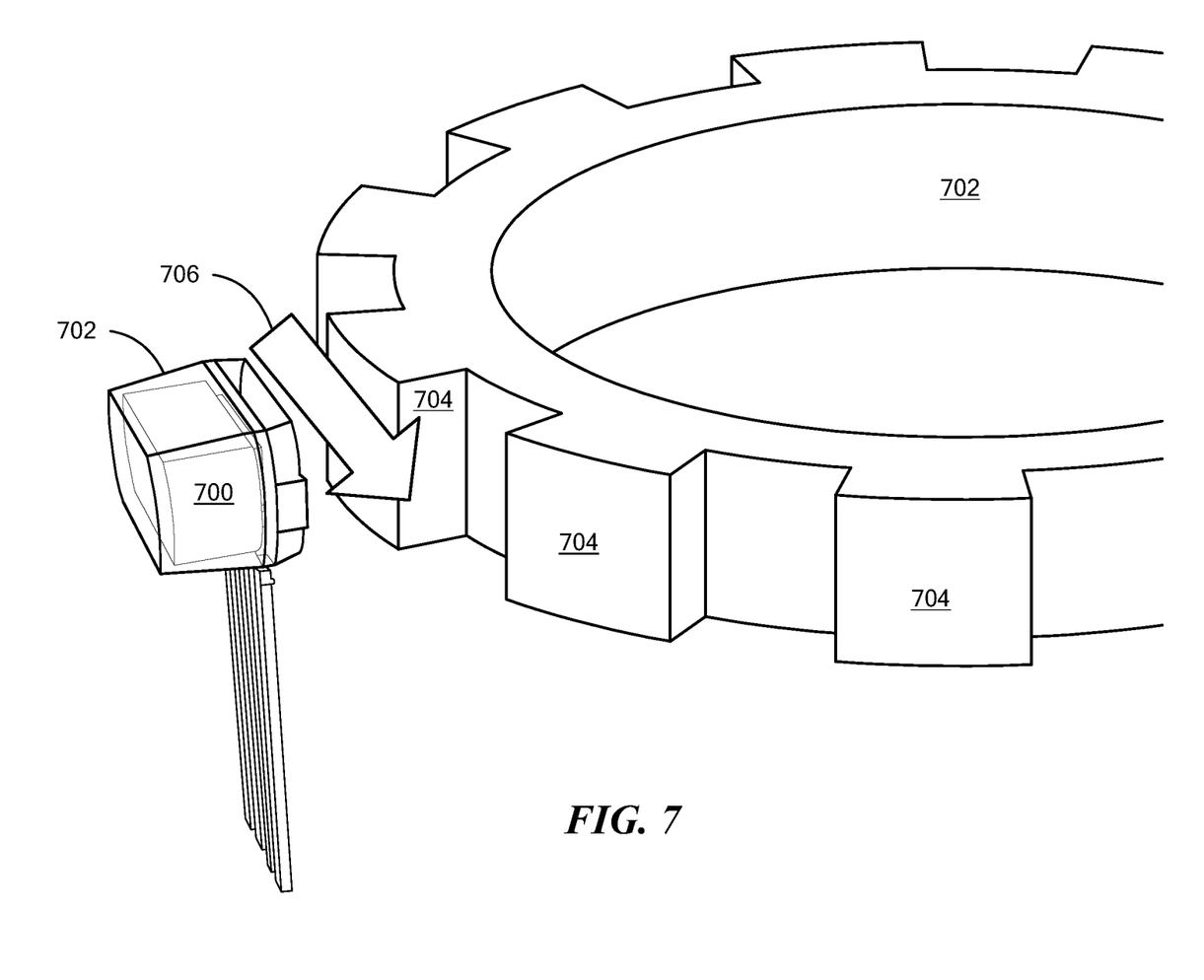
FIG. 7 is a diagram of an example of a magnetic field sensor package having one or more dual double-pinned spin valve elements with pinned layers each having a magnetization in the same direction.

Referring to FIG. 7, the dual double-pinned spin valve element with pinned layers (e.g., the MR element 400 in FIG. 4, or the MR element 400' and 400' in FIG. 5) may be fabricated in a magnetic field sensor 700. The magnetic field sensor 700 may be fabricated on a die (not shown) in an integrated circuit (IC) package 702 in a first orientation in relation to a rotating structure 702 having gear teeth 704 (a target). In one example, the IC package 702 includes a magnet. In another example, the magnet is located outside of the IC package 702.

In one example, the back-bias position of the magnetic field sensor 700 can be considered the zero-degree position. The axis of sensitivity 706 is shown for the magnetic field sensor 700. In other examples, the magnetic field sensor 700 may be rotated to any angle in the plane of the die (e.g., to enable the sensitive axis to be parallel to an axis of rotation of the target).

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A dual double-pinned spin valve element, comprising:
   a first spin valve comprising:
      a first bias layer comprising a first pinned layer; and
      a first reference layer comprising a second pinned layer; and
   a second spin valve disposed on the first spin valve and comprising:
      a second bias layer comprising a third pinned layer; and
      a second reference layer comprising a fourth pinned layer,
   wherein the first, second, third and fourth pinned layers each have a magnetization in a first direction.

2. The dual double-pinned spin valve element of claim 1, wherein the first direction is perpendicular to a magnet bias direction.

3. The dual double-pinned spin valve element of claim 1, wherein the first spin valve and the second spin valve share a pinning layer.

4. The dual double-pinned spin valve element of claim 1, wherein the first bias layer further comprises a first pinning layer, and
   wherein the first reference layer further comprises a second pinning layer.

5. The dual double-pinned spin valve element of claim 4, wherein the first spin valve further comprises a first free layer having a magnetization in the first direction.

6. The dual double-pinned spin valve element of claim 5, wherein the first bias layer further comprises a first spacer layer,
wherein a thickness of the first spacer layer enables ferromagnetic coupling between the first bias layer and the first free layer.

7. The dual double-pinned spin valve element of claim 4, wherein the second bias layer further comprises a third pinning layer, and
wherein the second reference layer further comprises a fourth pinning layer.

8. The dual double-pinned spin valve element of claim 7, wherein the second spin valve further comprises a second free layer having a magnetization antiparallel to the first direction.

9. The dual double-pinned spin valve element of claim 8, wherein the second bias layer further comprises a second spacer layer,
wherein a thickness of the second spacer layer enables antiferromagnetic coupling between the second bias layer and the second free layer.

10. The dual double-pinned spin valve element of claim 1, wherein the first or second spin valve is one of a tunneling magnetoresistance element or a giant magnetoresistance (GMR) element.

11. A method comprising:
depositing a stack comprising a dual double-pinned spin valve element, wherein the dual double-pinned spin valve element comprises:
a first spin valve comprising:
a first bias layer comprising a first pinned layer; and
a first reference layer comprising a second pinned layer; and
a second spin valve disposed on the first spin valve and comprising:
a second bias layer comprising a third pinned layer; and
a second reference layer comprising a fourth pinned layer;
performing an anneal on the stack,
wherein the anneal enables that each of the first, second, third and fourth pinned layers to have a magnetic direction that is parallel to each other in a first direction.

12. The method of claim 11, wherein performing the anneal comprises performing the anneal at a temperature of about 290° C. for about an hour with a magnetic field having about 10,000 Oersted.

13. The method of claim 11, wherein the first bias layer further comprises a first pinning layer,
wherein the first reference layer further comprises a second pinning layer,
wherein the second bias layer further comprises a third pinning layer, and
wherein the second reference layer further comprises a fourth pinning layer.

14. The method of claim 13, wherein the first spin valve further comprises a first free layer having a magnetization in the first direction,
wherein the first bias layer further comprises a first spacer layer,
wherein a thickness of the first spacer layer enables ferromagnetic coupling between the first bias layer and the first free layer,
wherein the second spin valve further comprises a second free layer having a magnetization antiparallel to the first direction,
wherein the second bias layer further comprises a second spacer layer, and
wherein a thickness of the second spacer layer enables antiferromagnetic coupling between the second bias layer and the second free layer.

15. The method of claim 11, wherein no other annealing is performed on the stack than the anneal.

16. A dual double-pinned spin valve element, comprising:
a first spin valve comprising:
a first bias layer comprising:
a first pinned layer; and
a first pinning layer;
a first reference layer comprising:
a second pinned layer; and
a second pinning layer; and
a second spin valve disposed on the first spin valve and comprising:
a second bias layer comprising:
a third pinned layer; and
a third pinning layer; and
a second reference layer comprising:
a fourth pinned layer; and
the second pinning layer,
wherein the first, second, third and fourth pinned layers each have a magnetization in a first direction, and
wherein the first or second spin valve is one of a tunneling magnetoresistance element or a giant magnetoresistance (GMR) element.

17. The dual double-pinned spin valve element of claim 16, wherein the first spin valve further comprises a first free layer having a magnetization in the first direction,
wherein the first bias layer further comprises a first spacer layer,
wherein a thickness of the first spacer layer enables ferromagnetic coupling between the first bias layer and the first free layer,
wherein the second spin valve further comprises a second free layer having a magnetization antiparallel to the first direction,
wherein the second bias layer further comprises a second spacer layer, and
wherein a thickness of the second spacer layer enables antiferromagnetic coupling between the second bias layer and the second free layer.

18. The dual double-pinned spin valve element of claim 17, wherein the first direction is perpendicular to a magnet bias direction.

19. A magnetic sensor, comprising:
a first dual double-pinned spin valve element comprising a first, second, third and fourth pinned layers each have a magnetization in a first direction; and
a second dual double-pinned spin valve element comprising a fifth, sixth, seventh and eighth pinned layers each have a magnetization in the first direction;
wherein the first dual double-pinned spin valve element and the second dual double-pinned spin valve element are connected in series or in parallel to each other,
wherein the first dual double-pinned spin valve element is biased by a first magnet in a second direction,
wherein the second dual double-pinned spin valve element is biased by a second magnet in a third direction, the third direction being in the opposite direction to the second direction.

20. The magnetic sensor of claim 19, wherein the first direction is perpendicular to the second direction and the third direction.

\* \* \* \* \*